(12) United States Patent
Kumar et al.

(10) Patent No.: US 12,020,911 B2
(45) Date of Patent: *Jun. 25, 2024

(54) CHUCKING PROCESS AND SYSTEM FOR SUBSTRATE PROCESSING CHAMBERS

(71) Applicant: Applied Materials, Inc., Santa Clara, CA (US)

(72) Inventors: Bhaskar Kumar, San Jose, CA (US); Ganesh Balasubramanian, Fremont, CA (US); Vivek Bharat Shah, Santa Clara, CA (US); Jiheng Zhao, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/975,452

(22) Filed: Oct. 27, 2022

(65) Prior Publication Data

US 2023/0048661 A1 Feb. 16, 2023

Related U.S. Application Data

(63) Continuation of application No. 16/803,479, filed on Feb. 27, 2020, now Pat. No. 11,488,811.

(Continued)

(51) Int. Cl.
*H01J 37/32* (2006.01)
*C23C 16/458* (2006.01)
(Continued)

(52) U.S. Cl.
CPC .... *H01J 37/32715* (2013.01); *C23C 16/4583* (2013.01); *C23C 16/50* (2013.01);
(Continued)

(58) Field of Classification Search
CPC .............. H01J 37/32715; H01J 37/321; H01J 2237/2007; H01J 2237/24564;
(Continued)

(56) References Cited

U.S. PATENT DOCUMENTS 5,325,261 A 6/1994 Horwitz
6,198,616 B1 3/2001 Dahimene et al.
(Continued)

FOREIGN PATENT DOCUMENTS

JP H05036806 A 2/1993
JP H11251420 A 9/1999
(Continued)

OTHER PUBLICATIONS

TW Office Action for Taiwan Patent Application No. 109107347 dated Apr. 13, 2023.
(Continued)

*Primary Examiner* — Karen Kusumakar
(74) *Attorney, Agent, or Firm* — Patterson + Sheridan, LLP (57) ABSTRACT

The present disclosure relates to methods and systems for chucking in substrate processing chambers. In one implementation, a method of chucking one or more substrates in a substrate processing chamber includes applying a chucking voltage to a pedestal. A substrate is disposed on a support surface of the pedestal. The method also includes ramping the chucking voltage from the applied voltage, detecting an impedance shift while ramping the chucking voltage, determining a corresponding chucking voltage at which the impedance shift occurs, and determining a refined chucking voltage based on the impedance shift and the corresponding chucking voltage.

20 Claims, 3 Drawing Sheets

Related U.S. Application Data (60) Provisional application No. 62/815,674, filed on Mar. 8, 2019.

(51) Int. Cl.
    *C23C 16/50*     (2006.01)
    *C23C 16/52*     (2006.01)

(52) U.S. Cl.
    CPC ............ C23C 16/52 (2013.01); H01J 37/321 (2013.01); *H01J 2237/2007* (2013.01); *H01J 2237/24564* (2013.01); *H01J 2237/3321* (2013.01)

(58) Field of Classification Search
    CPC ......... H01J 2237/3321; C23C 16/4583; C23C 16/50; C23C 16/52; C23C 16/4586; C23C 16/509; H01L 21/6833; H02N 13/00
    See application file for complete search history.

(56) References Cited

U.S. PATENT DOCUMENTS

| | | | |
|---|---|---|---|
| 6,377,060 | B1 | 4/2002 | Burkhart et al. |
| 8,491,759 | B2 | 7/2013 | Pipitone et al. |
| 9,807,863 | B1 | 10/2017 | Van Zyl |
| 2008/0084650 | A1 | 4/2008 | Balasubramanian et al. |
| 2011/0065279 | A1 | 3/2011 | Buchberger, Jr. et al. |
| 2011/0090613 | A1* | 4/2011 | Balasubramanian ........ H01L 21/6831 702/65 |
| 2013/0003250 | A1 | 1/2013 | Morimoto et al. |
| 2018/0330926 | A1 | 11/2018 | Boyd, Jr. et al. |

FOREIGN PATENT DOCUMENTS

| | | |
|---|---|---|
| JP | 2002505036 A | 2/2002 |
| JP | 2011138878 A | 7/2011 |
| JP | 2017527115 A | 9/2017 |
| KR | 20170042359 A | 4/2017 |
| WO | 2011118159 A1 | 9/2011 |

OTHER PUBLICATIONS

International Search Report and Written Opinion dated Jun. 19, 2020 for Application No. PCT/US2020/020127.

JP Office Action for Japanese Application No. 2021-552812 dated Apr. 9, 2024.

\* cited by examiner

CHUCKING PROCESS AND SYSTEM FOR SUBSTRATE PROCESSING CHAMBERS

CROSS-REFERENCE TO RELATED APPLICATIONS

This application is a continuation of U.S. patent application Ser. No. 16/803,479, filed Feb. 27, 2020. Application Ser. No. 16/803,479 claims benefit of U.S. provisional patent application Ser. No. 62/815,674, filed Mar. 8, 2019. Both application Ser. No. 16/803,479 and application Ser. No. 62/815,674 are incorporated herein by reference in their entireties.

BACKGROUND

Field

Aspects of the present disclosure relate generally to methods and systems for operating substrate processing chambers, including methods of chucking substrates.

Description of the Related Art

During processing of a substrate, sometimes the substrate is chucked to a pedestal within a substrate processing chamber. For example, a substrate might be chucked to a pedestal during processing when the substrate is bowed. However, due to variances in the pedestal's characteristics, and/or variances in the substrate's characteristics, it is difficult, costly, and time-consuming to determine a chucking voltage that should be applied to the pedestal during processing. If too low of a chucking voltage is applied, arcing can occur during substrate processing. The substrate can also experience backside damage if too high of a chucking voltage is applied, leading to defects and lower yield of substrate processing operations.

Therefore, there is a need for an improved method of chucking a substrate that reduces or eliminates backside damage and arcing and improves yield in a cost-effective manner.

SUMMARY

Implementations of the present disclosure generally relate to methods and systems for operating substrate processing chambers, including methods of chucking substrates.

In one implementation, a method of chucking one or more substrates in a substrate processing chamber includes applying a chucking voltage to a pedestal. A substrate is disposed on a support surface of the pedestal. The method also includes ramping the chucking voltage from the applied voltage, detecting an impedance shift while ramping the chucking voltage, and determining a corresponding chucking voltage at which the impedance shift occurs. The method also includes determining a refined chucking voltage based on the impedance shift and the corresponding chucking voltage.

In one implementation, a method of chucking one or more substrates in a substrate processing chamber includes applying a chucking voltage to a pedestal using a preselected value. A substrate is disposed on a support surface of the pedestal. The method also includes detecting an impedance shift, determining a refined chucking voltage based on the impedance shift, and adjusting the applied chucking voltage using the refined chucking voltage.

In one implementation, a controller for substrate processing chamber systems includes a processor. The controller includes a set of computer instructions that, when executed, instruct the processor to cause a direct current voltage generator to apply a chucking voltage to a pedestal. The set of computer instructions, when executed, cause an impedance detector to detect an impedance shift of a radio frequency energy generator, and determine a refined chucking voltage based on the impedance shift.

BRIEF DESCRIPTION OF THE DRAWINGS

So that the manner in which the above recited features of the disclosure can be understood in detail, a more particular description of the disclosure, briefly summarized above, may be had by reference to implementations, some of which are illustrated in the appended drawings. It is to be noted, however, that the appended drawings illustrate only common implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements disclosed in one implementation may be beneficially utilized on other implementations without specific recitation.

DETAILED DESCRIPTION

Figure 1:
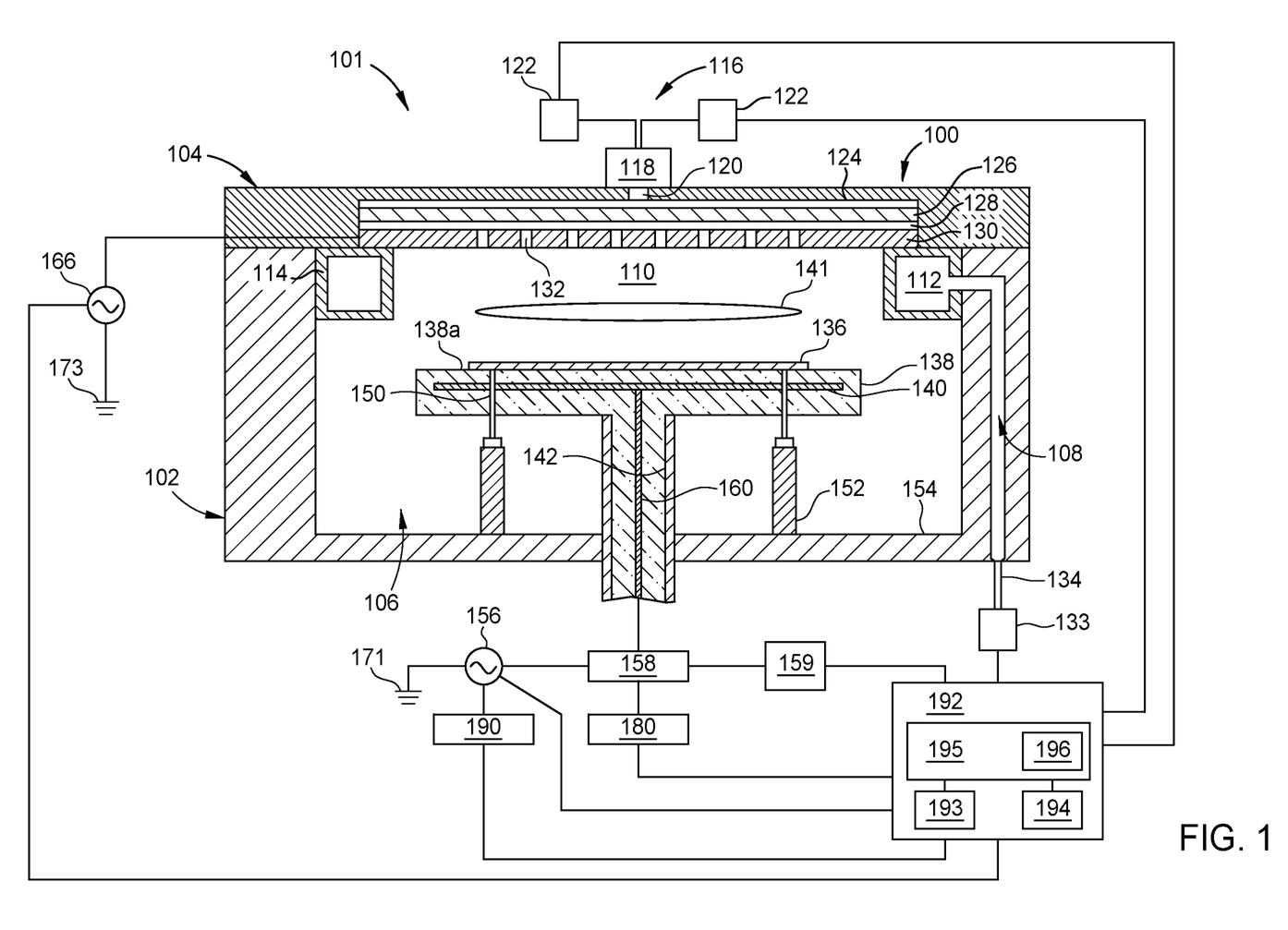
FIG. 1 is a partial schematic cross-sectional view of a substrate processing chamber system, according to one implementation.

The present disclosure relates to methods and systems for chucking a substrate in a substrate processing chamber. FIG. 1 illustrates a partial schematic cross-sectional view of a substrate processing chamber system 101, according to one implementation. The substrate processing chamber system 101 includes a chamber 100 having a pedestal 138 disposed therein. The chamber 100 may be, for example, a chemical vapor deposition (CVD) chamber, a plasma enhanced CVD (PECVD) chamber, or a physical vapor deposition (PVD) chamber. The chamber 100 has a chamber body 102 and a chamber lid 104. The chamber body 102 includes an internal volume 106 therein and a pumping path 108. The internal volume 106 is the space defined by the chamber body 102 and the chamber lid 104. The pumping path 108 is a path formed in the chamber body 102 coupled to a pumping volume 112 formed in a pumping plate 114. The pumping path 108 facilitates removal of gases from the internal volume 106.

The chamber 100 includes a gas distribution assembly 116 coupled to and/or disposed in the chamber lid 104 to deliver a flow of one or more gases into a processing region 110. The processing region 110 includes a portion of the internal volume 106 located between the substrate support 138 and the chamber lid 104. The gases delivered by the gas distribution assembly 116 may include, for example, one or more processing gases (such as one or more inert gases and/or one or more precursor gases). In one example, the one or more processing gases include a precursor gas that includes tetraethyl orthosilicate (TEOS) to form film on the substrate 136. The gas distribution assembly 116 includes a gas manifold 118 coupled to a gas inlet passage 120 formed in the chamber lid 104. The gas manifold 118 receives a flow of gases from one or more gas sources 122 (two are shown). The flow of gases received from the one or more gas sources 122 distributes across a gas box 124, flows through a plurality of openings of a backing plate 126, and further distributes across a plenum 128 defined by the backing plate 126 and a faceplate 130. The flow of gases then flows into the processing region 110 of the internal volume 106 through a plurality of openings 132 of the faceplate 130. A pump 133 is connected to the pumping path 108 by a conduit 134 to control the pressure within a processing region 110 and to exhaust gases and byproducts from the processing region 110 through the pumping volume 112 and pumping path 108.

The internal volume 106 includes a pedestal 138 that supports a substrate 136 within the chamber 100 on a support surface 138a of the pedestal 138. The pedestal 138 includes an electrode 140 disposed within the pedestal 138. The electrode 140 may include a conductive mesh, such as a tungsten-containing, copper-containing, or molybdenum-containing conductive mesh. The electrode 140 may include any material used for heating, including an alternating current (AC) coil. The electrode 140 is coupled to a power source 159, such as a direct current (DC) voltage generator. The electrode 140 is configured to supply a chucking voltage to the pedestal 138 that is received from the DC voltage generator 159. The chucking voltage applies a chucking force to the substrate 136 such that the substrate 136 is chucked to the support surface 138a of the pedestal 138. Electrostatic forces applied to the substrate 136 result in the substrate being pulled down toward the electrode 140 to facilitate chucking the substrate 136 to the support surface 138a. The chucking force acting on the substrate 136 facilitates eliminating a bow of the substrate 136, or flattening the substrate 136.

The electrode 140 is coupled to a radio frequency (RF) energy generator 156. The electrode 140 is configured to propagate RF received from the RF energy generator 156 through the pedestal 138 and into the processing region 110. The electrode 140, for example, can propagate RF energy while one or more processing gases are present in the processing region 110 such that a plasma 141 is generated in the processing region 110.

The electrode 140 is coupled to a heating power source 180 that supplies heating power to the electrode 140. The heating power may be, for example, an alternating current (AC). The electrode 140 is configured to heat the pedestal 138 with the heating power received from the heating power source 180.

The electrode 140 is coupled to the RF energy generator 156, the heating power source 180, and the DC voltage generator 159 through a conductive rod 160 and a matching circuit 158. An impedance detector 190 is coupled to the RF energy generator 156. The impedance detector 190 is configured to detect an impedance shift of the RF energy generator 156 while the DC voltage generator 159 applies a chucking voltage to the pedestal 138, through the electrode 140. In one embodiment, which can be combined with other embodiments, the impedance detector 190 is additionally or alternatively coupled to other components of the substrate processing chamber system 101. For example, the impedance detector 190 may be coupled to, and configured to detect an impedance shift in, one or more of the substrate 136, pedestal 138, electrode 140, heating power source 180, DC voltage generator 159, chamber body 102, chamber lid 104, support surface 138a, faceplate 130, backing plate 126, and/or a second RF energy generator 166. The present disclosure contemplates that the impedance detector 190 can be configured to detect an impedance shift of any component of the substrate processing chamber system 101, and to use such information in accordance with aspects disclosed herein.

The pedestal 138 is movably disposed in the internal volume 106 by a stem 142 coupled to a lift system. Movement of the pedestal 138 facilitates transfer of the substrate 136 to and from the internal volume 106 through a slit valve formed through the chamber body 102. The pedestal 138 may also be moved to different processing positions for processing of the substrate 136. The pedestal 138 may also have openings disposed therethrough, through which a plurality of lift pins 150 may be movably disposed. In the lowered position, the plurality of lift pins 150 are projected from the pedestal 138 by contacting a lift plate 152 coupled to a bottom 154 of the chamber body. Projection of the lift pins 150 places the substrate 136 in a spaced-apart relation from the pedestal 138 to facilitate the transfer of the substrate 136.

During substrate processing, as gases flow into the processing region 110, the electrode 140 heats the pedestal 138. Also during substrate processing, the electrode 140 propagates radio frequency (RF) energy, alternating current (AC), or direct current (DC) to facilitate plasma generation in the processing region 110 and/or to facilitate chucking of the substrate 136 to the pedestal 138. The heat, gases, and energy from the electrode 140 facilitate deposition of a film onto the substrate 136 during substrate processing.

The faceplate 130, which is grounded via coupling to the chamber body 102, and the electrode 140 facilitate generation of plasma 141. For example, the RF energy generator 156 provides RF energy to the electrode 140 within the pedestal 138 to facilitate generation of plasma 141 between the pedestal 138 and the faceplate 130 of the gas distribution assembly 116. The RF energy generator 156 connects to ground 171. A second RF energy generator 166 also is configured to provide RF energy to the chamber 100. The second RF energy generator 166 is connected to ground 173. Although a second RF energy generator 166 is illustrated, the present disclosure contemplates that other power sources may be used in place of or in conjunction with the second RF energy generator 166. For example, a second alternating current (AC) power source or a second direct current (DC) power source may be used. The present disclosure contemplates that the second AC power source and/or the second DC power source may be coupled to the impedance detector 190.

The substrate processing chamber system 101 includes a controller 192 that is configured to control one or more of the components of the substrate processing chamber system 101. The controller 192 includes a central processing unit (CPU) 193, support circuitry 194, and memory 195 containing associated control software 196. The CPU 193 may include a processor. The control software 196 includes a set of computer instructions that, when executed, instruct the CPU 193 of the controller 192 to cause one or more operations to be carried out using one or more components of the substrate processing chamber system 101. The controller 192 may include any form of a general purpose computer processor that can be used in an industrial setting for controlling various chambers and sub-processors. The CPU 193 may use any suitable memory 195, such as random access memory, read only memory, floppy disk drive, compact disc drive, hard disk, or any other form of digital storage, local or remote. Various support circuits may be coupled to the CPU 193 for supporting the chamber 100. The controller 192 may be coupled to another controller that is located adjacent individual chamber components. Bi-directional communications between the controller 192 and various other components of the chamber 100 are handled through numerous signal cables collectively referred to as signal buses, some of which are shown in FIG. 1.

The controller 192 illustrated in FIG. 1 is configured to control at least the one or more gas sources 122, pump 133, RF energy generator 156, DC voltage generator 159, second RF energy generator 166, heating power source 180, and impedance detector 190. In one embodiment, which can be combined with other embodiments, the controller 192 is configured to, when executed by a processor (such as the CPU 193), cause one or more of the operations illustrated in method 200 of FIG. 2 to be carried out. In one example the control software 196 includes a set of computer instructions that, when executed, instruct the CPU 193 of the controller 192 to cause one or more operations illustrated in method 200 of FIG. 2 to be carried out.

Figure 2:
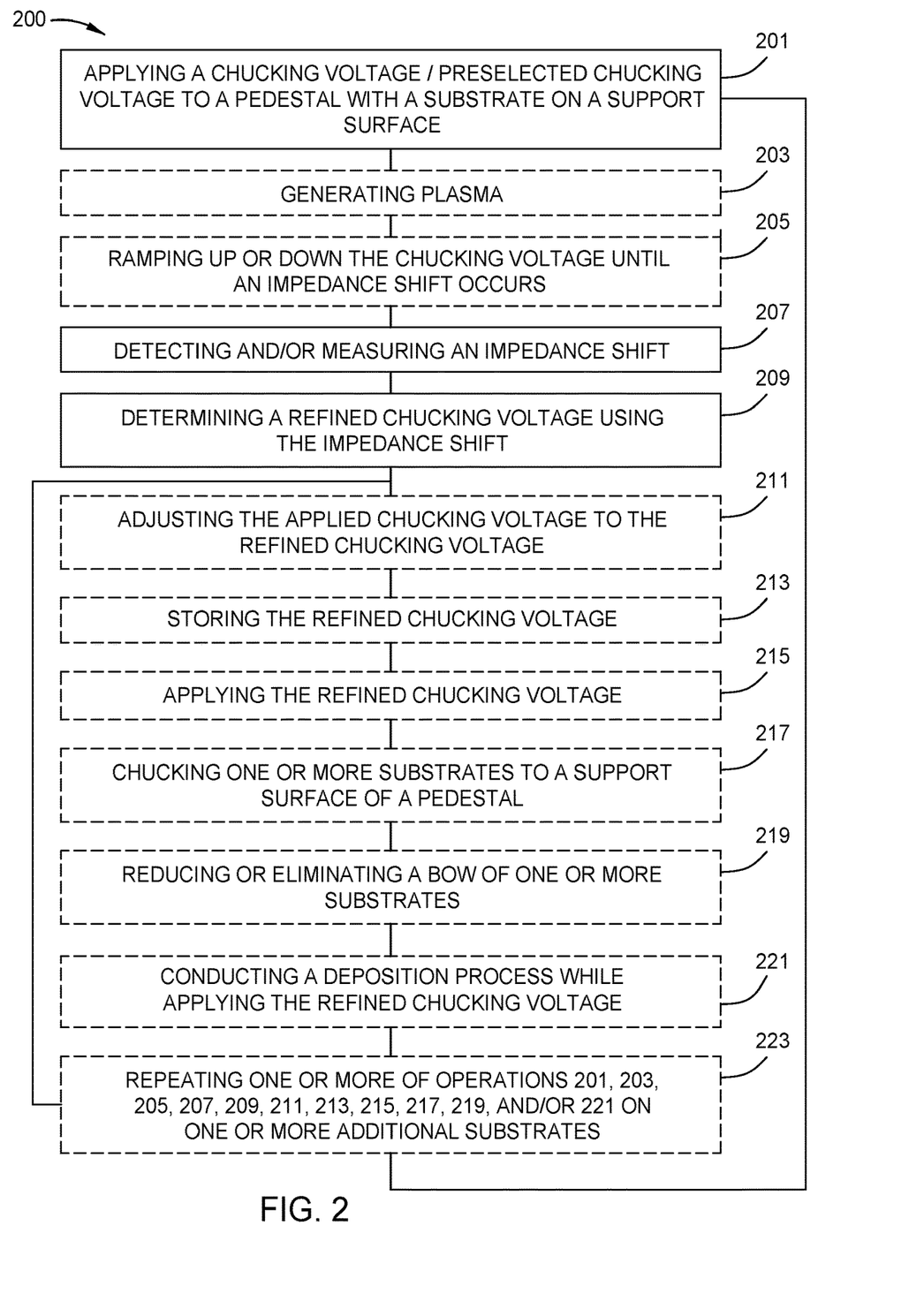
FIG. 2 is a schematic illustration of a method of chucking a substrate in a substrate processing chamber, according to one implementation.

FIG. 2 is a schematic illustration of a method 200 of chucking a substrate in a substrate processing chamber. At operation 201, a chucking voltage is applied to a pedestal with a substrate disposed on a support surface of the pedestal and/or radio frequency (RF) energy is supplied to a substrate processing chamber. In one embodiment, which can be combined with other embodiments, the chucking voltage is applied using a preselected value for the chucking voltage. The preselected value may be obtained based on, for example, the specifications of a processing chamber, substrate, pedestal, or electrode, or a material thereof. The preselected value could be obtained from prior substrate processing or chucking operations. In one example, the preselected value is obtained using one or more experimental runs when a new pedestal, chamber, and/or substrate is used in substrate processing operations.

In optional operation 203, a plasma, such as an inert plasma, is generated. At optional operation 205, the chucking voltage is ramped up or down until an impedance shift occurs. Alternatively, the chucking voltage may be ramped up from the applied voltage to a second greater voltage, in order to identify the voltage between the applied voltage and the second greater voltage at which the impedance shift occurs. In one embodiment, which can be combined with other embodiments, the second greater voltage is a preselected value. An impedance shift is detected at operation 207. The impedance shift signals that the substrate is chucked to the support surface of the pedestal.

In one embodiment, which can be combined with other embodiments, the chucking voltage is ramped up or down in one or more voltage increments until the impedance shift occurs. In one example, the chucking voltage is ramped upward in increments of 50 Volts that are each applied for 5 or more seconds (such as 10 or more seconds) to allow impedance sensor stabilization, until the impedance shift occurs. In one example, the chucking voltage is ramped downward in increments of 100 Volts that are each applied for 5 or more seconds (such as 10 or more seconds) until the impedance shift occurs.

The impedance shift is a shift in impedance of at least a predetermined amount, such as 0.5 Ohms or more. In one embodiment, which can be combined with other embodiments, a first impedance value is measured after the chucking voltage is applied at block 201 for a predetermined time period, such as a time of 5 or more seconds (such as 10 or more seconds). In such an embodiment, a second impedance value is measured after ramping the chucking voltage at block 205 and applying the ramped chucking voltage for another equal or different time period, such as about 5 or more seconds (such as 10 or more seconds). Applying the chucking voltage for the predetermined time period allows the impedance values to settle for accurate measurements. The difference between the first impedance value and the second impedance value indicates the impedance shift. A shift is deemed to occur when the delta between measured impedance values exceeds a predetermined threshold amount. In one example, a shift of 0.5 Ohms or more indicates that the substrate is chucked and/or a bow of the substrate is reduced or eliminated. It is to be noted however, other shift values are contemplated.

In one embodiment, which can be combined with other embodiments, an impedance shift is used to verify that the substrate is chucked and/or a bow of the substrate is reduced or eliminated. In such an embodiment, an impedance shift at block 207 of a value less than a target value, such as 0.1 Ohms or less, is used to verify the substrate is chucked to a pedestal. In one example, a second impedance shift is measured after the impedance shift is measured at block 207. If the second impedance shift is equal to or less than a target value, such as 0.1 Ohms or less, then chucking of the substrate to the pedestal is verified. If the second impedance shift is greater than the predetermined target value for confirming chucking, then it is possible that the substrate has become at least partially un-chucked from pedestal.

Not to be bound by theory, it is believed that the impedance shift is caused by a change in flow of electrical charge between the substrate and other component(s) of a substrate processing chamber system. For example, chucking of the substrate can remove a bow of the substrate such that the substrate flattens out toward the support surface of the pedestal, reducing one or more gaps between the substrate and the support surface. Reducing one or more gaps between the substrate and the support surface causes a change in the flow of electric charge between the substrate and other component(s) such as the pedestal. The change in flow of electric charge causes an impedance shift in one or more components of the substrate processing chamber system.

In one embodiment, which can be combined with other embodiments, the operation of detecting the impedance shift includes measuring the impedance shift. Devices such as impedance detectors (for example the impedance detector 190 described above) may be used to detect and/or measure the impedance shift. In one embodiment, which can be combined with other embodiments, the impedance shift is an impedance shift of a radio frequency (RF) energy generator that supplies radio frequency energy to the substrate processing chamber. The present disclosure contemplates that the impedance shift can be detected and/or measured on any component of the substrate processing chamber. At operation, 209 a refined chucking voltage is determined using the impedance shift. In one embodiment, which can be combined with other embodiments, the refined chucking voltage is a minimum voltage value that will chuck the substrate to the support surface of the pedestal, for example, without any bow. In one example, the refined chucking voltage is the chucking voltage applied at the instant the impedance shift occurs. Determining and using a refined chucking voltage facilitates increasing the probability that a substrate will chuck to a support surface of a pedestal in operations involving substrates, chambers, or pedestals that have varying characteristics. Chucking a substrate facilitates reducing or eliminating a bow of the substrate and facilitates reducing the probability of arcing occurring by removing or mitigating gaps between the substrate support surface and a backside of the substrate. A reduction in the probability of arcing facilitates a reduction of substrate defects and improved yield of substrate processing operations. Using a refined chucking voltage also allows operators the option of not using high chucking voltages during substrate processing that would cause backside damage on the substrates. Reducing the probability of backside damage reduces the probability of substrate defects and improves the yield of substrate processing operations.

In one example, the refined chucking voltage may be based on the chucking voltage at the instant of the impedance shift, plus an additional amount of voltage to ensure chucking. For example, the refined chucking voltage may be equal to the chucking voltage at the instant of the impedance shift, plus 5 percent, 10 percent, 15 percent, 20 percent, 25 percent, or the like. In such an example, the refined chucking voltage may be determined on a first substrate or batch of substrates, and subsequently applied for multiple processing runs. The inclusion of the additional amount of voltage increases the likelihood that the refined chucking voltage will facilitate chucking and the benefits described herein for many process substrates, without the need for performing method 200 on each individual substrate during processing. It is also contemplated that method 200 may be performed on each substrate during processing such that the refined chucking voltage is the optimal chucking voltage for each individual substrate.

In one optional embodiment, which can be combined with other embodiments, the refined chucking voltage is determined by generating a first image of a first impedance trace (e.g., a graph of impedance value vs time, for one or more applied voltages) that is measured while the applied chucking voltage and/or the ramped chucking voltage is applied to the substrate for a predetermined time period, such as 5 or more seconds. The first image of the first impedance trace is compared to a second image of a second impedance trace measured for the same voltage applied to a different substrate for the same time period. In one example, the different substrate is a flat silicon substrate that does not include a bow. If the first impedance trace matches the second impedance trace, then the applied voltage for the first impedance trace is determined to be the refined chucking voltage. If the first impedance trace does not match the second impedance trace, then the applied voltage is ramped until the first impedance trace matches the second impedance trace. In one example, the first impedance trace matching the second impedance trace is used to confirm a proper voltage value for the refined chucking voltage when the refined chucking voltage is determined using the predetermined amount, as discussed above.

By using an impedance shift to determine the refined chucking voltage, the refined chucking voltage can be determined in real time during substrate processing operations. Substrate processing operations need not wait until a deposition process on a substrate has ended such that the substrate is inspected to determine if the applied chucking voltage was sufficient. This facilitates savings for time and cost for the substrate processing operations, and facilitates improved yield.

At optional operation 211, the applied chucking voltage is adjusted to the refined chucking voltage. Adjusting the applied chucking voltage to the refined chucking voltage for subsequent processing can achieve the benefits described herein with respect to the refined chucking voltage in a timely and cost-effective manner. The refined chucking voltage also allows substrate processing operations to efficiently account for and adapt to varying characteristics between different substrates. For example, if a new pedestal is used in substrate processing operations, that pedestal can have a differing thermal conductivity as compared to the pedestal that was previously used. Adjusting the applied chucking voltage using the refined chucking voltage allows substrate processing operations to efficiently adapt to the different properties of the new pedestal, as compared to the prior pedestal. This can be done each time a new pedestal is used. As another example, the refined chucking voltage may be used to adjust a preselected value that was obtained from specifications for the new pedestal. In one aspect, one or more operations of the method 200 are performed each time a new pedestal is used in substrate processing operations.

As another example, if new substrates are used in a substrate processing chamber, the new substrates can have different bow characteristics than previously processed substrates. Different bow characteristics can involve different chucking voltages that would eliminate bow in the substrates. Utilizing aspects discussed herein, a chucking voltage can be applied to substrates which eliminates or mitigates bow without being excessive such that the likelihood of backside damage is reduced.

At optional operation 213, the refined chucking voltage is stored. In one embodiment, which can be combined with other embodiments, the refined chucking voltage is stored in a memory for use in subsequent substrate processing operations. At optional operation 215, the refined chucking voltage is applied. At optional operation 217, in response to application of the refined chucking voltage, one or more substrates are chucked to a support surface of a pedestal. The one or more substrates of optional operation 217 may include the substrate used in operation 201. The one or more substrates of optional operation 217 may be different than the substrate used in operation 201. The one or more substrates of optional operation 217 may include a second substrate and/or a third substrate that are different than the substrate used in operation 201.

At optional operation 219, in response to application of the refined chucking voltage, a bow of one or more substrates is reduced or eliminated. The one or more substrates of optional operation 219 may include the substrate used in operation 201. The one or more substrates of optional operation 219 may be different than the substrate used in operation 201. The one or more substrates of optional operation 219 may include a second substrate and/or a third substrate that are different than the substrate used in operation 201.

At optional operation 221, a deposition process is conducted while applying the refined chucking voltage. For example, a film may be deposited onto one or more substrates using one or more process gases and generated processing plasma that cause a film to deposit onto one or more substrates.

At optional operation 223, one or more of operations 201, 203, 205, 207, 209, 211, 213, 215, 217, 219, and/or 221 are repeated on one or more additional substrates. The one or more additional substrates of optional operation 223 may include a second substrate and/or a third substrate that are different than the substrate used in operation 201.

The method 200 is not limited to the sequence or number of operations illustrated in FIG. 2, but may include other implementations that include re-ordering, repeating, adding, and/or removing one or more of the operations 201, 203, 205, 207, 209, 211, 213, 215, 217, 219, 221, and/or 223.

Figure 3:
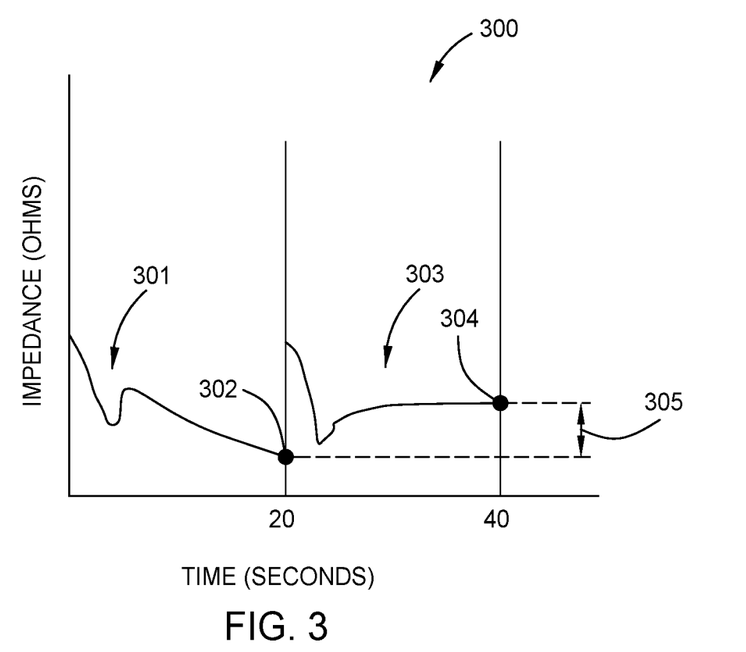
FIG. 3 is an illustration of an image showing an impedance shift, according to one implementation.

FIG. 3 is an illustration of an image 300 showing an impedance shift, according to one implementation. The image 300 illustrates an impedance shift that occurs after a chucking voltage is ramped up. In the implementation shown, a first chucking voltage, for example 550 Volts, is applied to a substrate for a predetermined time period, such as 20 seconds. While the first chucking voltage is applied, a first impedance trace 301 is generated by measuring impedance throughout the 20 seconds. A first impedance value 302 is measured after the predetermined time period elapses. The chucking voltage is ramped up by a predetermined voltage increment, for example, of 50 Volts or for about 10 percent, to apply a second chucking voltage (such as 600 Volts) to the same substrate for an additional period of time. In one example, the additional period of time is the same as first period of time, such as 20 seconds. While the second chucking voltage is applied, a second impedance trace 303 is generated by measuring impedance throughout the additional 20 seconds. A second impedance value 304 is measured after the second time period (e.g., 20 seconds) elapses. As illustrated in the impedance of the second impedance trace 303 is substantially settled after the additional 20 seconds has elapsed. This process is repeated, comparing the settled impedance to the previously-settled impedance, until a shift in impedance of at least a threshold value is determined.

A difference 305 between the second impedance value 304 and the first impedance value 302 of at least the threshold value (e.g., 0.5 Ohms) indicates a bow of the substrate is reduced or eliminated. The impedance shift indicates that the second chucking voltage corresponds to a chucking voltage at which chucking of a substrate to a support surface occurs. Thus, excess application of power for chucking is unnecessary.

It is to be noted that the image 300 is only an example, and that other images may be generated or detected. Benefits of the present disclosure include reduced arcing, improved chucking of substrates to pedestal support surfaces, reduced backside damage, timely and efficient adaptation to changing equipment properties, enhanced yield, and lower operational costs. Aspects of the present disclosure include applying a chucking voltage to a pedestal; applying a chucking voltage to a pedestal using a preselected value; ramping up the chucking voltage until an impedance shift occurs; detecting an impedance shift; determining a refined chucking voltage based on the impedance shift; and adjusting the applied chucking voltage to the refined chucking voltage.

It is contemplated that one or more of these aspects disclosed herein may be combined. Moreover, it is contemplated that one or more of these aspects may include some or all of the aforementioned benefits.

While the foregoing is directed to embodiments of the present disclosure, other and further embodiments of the disclosure may be devised without departing from the basic scope thereof. The present disclosure also contemplates that one or more aspects of the embodiments described herein may be substituted in for one or more of the other aspects described. The scope of the disclosure is determined by the claims that follow.

What is claimed is:

1. A method of chucking substrates in a substrate processing chamber, comprising:
while a first substrate is disposed on a support surface of a pedestal:
applying a first value of a chucking voltage to the pedestal;
ramping the chucking voltage from the first value;
detecting an impedance shift while ramping the chucking voltage;
determining a corresponding second value of the chucking voltage at which the impedance shift occurs; and
determining a third value of the chucking voltage based on the impedance shift and the corresponding second value of the chucking voltage; and
while a second substrate is disposed on the support surface of the pedestal, applying the third value of the chucking voltage to the pedestal.

2. The method of claim 1, wherein the impedance shift is an impedance shift of a radio frequency energy generator that supplies radio frequency energy to the substrate processing chamber.

3. The method of claim 1, wherein the detecting the impedance shift comprises measuring the impedance shift.

4. The method of claim 1, further comprising conducting a deposition process on the second substrate while applying the third value of the chucking voltage to the pedestal.

5. The method of claim 1, wherein ramping the chucking voltage from the first value comprises ramping up the chucking voltage until the impedance shift occurs.

6. The method of claim 1, wherein the third value of the chucking voltage is a minimum voltage value that chucks the first substrate to the support surface of the pedestal.

7. The method of claim 1, wherein the third value of the chucking voltage reduces a bow of the first substrate.

8. A method of chucking substrates in a substrate processing chamber, comprising:
while a first substrate is disposed on a support surface of a pedestal, determining a first value of a chucking voltage to apply to the pedestal in order to chuck the first substrate to the support surface of the pedestal; and
while a second substrate is disposed on the support surface of the pedestal:
applying the first value of the chucking voltage to the pedestal;
ramping the chucking voltage from the first value;
detecting an impedance shift while ramping the chucking voltage;
determining a corresponding second value of the chucking voltage at which the impedance shift occurs;
determining a third value of the chucking voltage based on the impedance shift and the corresponding second value of the chucking voltage; and
applying the third value of the chucking voltage to the pedestal.

9. The method of claim 8, wherein the impedance shift is an impedance shift of a radio frequency energy generator that supplies radio frequency energy to the substrate processing chamber.

10. The method of claim 8, wherein the detecting the impedance shift comprises measuring the impedance shift.

11. The method of claim 8, further comprising conducting a deposition process on the second substrate while applying the third value of the chucking voltage to the pedestal.

12. The method of claim 8, wherein ramping the chucking voltage from the first value comprises ramping up the chucking voltage until the impedance shift occurs.

13. The method of claim 8, wherein the third value of the chucking voltage is a minimum voltage value that chucks the second substrate to the support surface of the pedestal.

14. The method of claim 8, wherein the third value of the chucking voltage reduces a bow of the second substrate.

15. A method of chucking one or more substrates in a substrate processing chamber, comprising:

from specifications of a pedestal installed in the substrate processing chamber, obtaining a first value of a chucking voltage to apply to the pedestal in order to chuck a first substrate to a support surface of the pedestal; and while the first substrate is disposed on the support surface of the pedestal:
- applying the first value of the chucking voltage to the pedestal;
- ramping the chucking voltage from the first value;
- detecting an impedance shift while ramping the chucking voltage;
- determining a corresponding second value of the chucking voltage at which the impedance shift occurs; and
- determining a third value of the chucking voltage based on the impedance shift and the corresponding second value of the chucking voltage.

16. The method of claim 15, further comprising applying the third value of the chucking voltage to the pedestal while a second substrate is disposed on the support surface of the pedestal.

17. The method of claim 16, further comprising conducting a deposition process on the second substrate while applying the third value of the chucking voltage to the pedestal.

18. The method of claim 17, further comprising generating a plasma while conducting the deposition process on the second substrate.

19. The method of claim 15, wherein the third value of the chucking voltage equals the second value of the chucking voltage plus 25 percent or less.

20. The method of claim 19, further comprising storing the third value of the chucking voltage in a memory of a controller of the substrate processing chamber.

* * * * *